(12) United States Patent
Uchida et al.

(10) Patent No.: US 7,796,662 B2
(45) Date of Patent: Sep. 14, 2010

(54) VERTICAL CAVITY SURFACE EMITTING LASER AND IMAGE FORMING APPARATUS USING THE VERTICAL CAVITY SURFACE EMITTING LASER

(75) Inventors: Takeshi Uchida, Tokyo (JP); Tetsuya Takeuchi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 11 days.

(21) Appl. No.: 12/209,250

(22) Filed: Sep. 12, 2008

(65) Prior Publication Data
US 2009/0080489 A1    Mar. 26, 2009

(30) Foreign Application Priority Data
Sep. 21, 2007   (JP) .............................. 2007-245540

(51) Int. Cl.
*H01S 5/00*   (2006.01)
(52) U.S. Cl. .............................. 372/46.013; 372/45.01; 372/46.01; 372/99
(58) Field of Classification Search .............. 372/45.01, 372/46.01, 46.013, 99
See application file for complete search history.

(56) References Cited

U.S. PATENT DOCUMENTS

| | | | | | |
|---|---|---|---|---|---|
| 5,463,410 | A | * | 10/1995 | Uchiyama et al. ............ | 347/133 |
| 5,568,499 | A | * | 10/1996 | Lear ......................... | 372/45.01 |
| 5,881,085 | A | * | 3/1999 | Jewell .................... | 372/46.013 |
| 6,317,446 | B1 | * | 11/2001 | Wipiejewski ............ | 372/46.01 |
| 6,570,905 | B1 | * | 5/2003 | Ebeling ....................... | 372/96 |
| 6,810,065 | B1 | | 10/2004 | Naone .......................... | 372/96 |
| 6,914,925 | B2 | * | 7/2005 | Shinagawa et al. .......... | 372/50.1 |
| 6,987,791 | B2 | * | 1/2006 | Kim ............................. | 372/96 |
| 6,990,135 | B2 | * | 1/2006 | Johnson et al. ............... | 372/96 |
| 7,006,544 | B2 | * | 2/2006 | Kuromizu et al. ......... | 372/43.01 |
| 7,295,745 | B2 | | 11/2007 | Uchida ........................ | 385/129 |
| 7,408,967 | B2 | * | 8/2008 | Collins et al. ............ | 372/46.01 |
| 2002/0167985 | A1 | * | 11/2002 | Shinagawa et al. ............ | 372/50 |
| 2005/0265415 | A1 | * | 12/2005 | Lambkin .................. | 372/43.01 |

(Continued)

FOREIGN PATENT DOCUMENTS

EP            0 905 835 A1     3/1999

(Continued)

OTHER PUBLICATIONS

M. Brunner et al., "Thermal lensing effects in small oxide confined vertical-cavity surface-emitting lasers," Applied Physics Letters, vol. 76, No. 1, Jan. 3, 2000, pp. 7-9.

(Continued)

*Primary Examiner*—Minsun Harvey
*Assistant Examiner*—Yuanda Zhang
(74) *Attorney, Agent, or Firm*—Fitzpatrick, Cella, Harper & Scinto

(57) ABSTRACT

Provided is a laser having a multilayer reflector that suppresses the multimode operation. A vertical cavity surface emitting laser includes a first mirror, a cavity having an active layer, and a second mirror that are laminated. The second mirror is a multilayer reflector comprised of a first layer and a second layer that are alternately plurally laminated, the second layer having a refractive index higher than that of the first layer. At least one of the plural second layers has an oxidized confinement structure having an oxidized region and a non-oxidized region.

6 Claims, 8 Drawing Sheets

U.S. PATENT DOCUMENTS

| | | | |
|---|---|---|---|
| 2006/0045162 A1 | 3/2006 | Johnson | 372/99 |
| 2007/0131950 A1 | 6/2007 | Takeuchi | 257/93 |
| 2007/0201527 A1 | 8/2007 | Hori et al. | 372/50.124 |
| 2008/0031297 A1 | 2/2008 | Uchida | 372/45.01 |
| 2008/0056320 A1 | 3/2008 | Takeuchi | 372/45.01 |
| 2008/0205462 A1 | 8/2008 | Uchida | 372/34 |
| 2009/0022199 A1 | 1/2009 | Jikutani et al. | 372/50.124 |

FOREIGN PATENT DOCUMENTS

| | | |
|---|---|---|
| EP | 1 955 855 A1 | 8/2008 |
| JP | 2007-299895 A | 11/2007 |
| WO | WO 2007/063806 A1 | 6/2007 |

OTHER PUBLICATIONS

N.G. Kim et. al., "Extending the Single-Mode-Operation Radius of the Oxide-VCSEL by Controlling the Thickness and Position of the Oxide-Layer," Journal of the Institute of Electronics Engineers of Korea, vol. 41-SD, No. 9, Sep. 2004, p. 31-37.

Grabherr, M., et al., "Efficient Single-Mode Oxide-Confined GaAs VCSEL's Emitting in the 850-nm Wavelength Regime", IEEE Photonics Technology Letters, vol. 9, No. 10, Oct. 1997, pp. 1304-1306.

* cited by examiner

VERTICAL CAVITY SURFACE EMITTING LASER AND IMAGE FORMING APPARATUS USING THE VERTICAL CAVITY SURFACE EMITTING LASER

BACKGROUND OF THE INVENTION

1. Field of the Invention

The present invention relates to a vertical cavity surface emitting laser. Further, the present invention relates to an image forming apparatus using the vertical cavity surface emitting laser.

2. Description of the Related Art

A vertical cavity surface emitting laser (hereinafter, referred to as VCSEL) is a laser device for emitting a laser beam in a direction perpendicular to an in-plane direction of a substrate.

The VCSEL is advantageous in that the manufacturing process can be simplified, and a two-dimensional array is easily achieved as compared with an edge-emitting laser. In recent years, the VCSEL has been intensively studied.

A distributed Bragg reflector (hereinafter, referred to as DBR) is normally used as a reflective layer of the VCSEL.

The DBR is generally formed by alternately laminating a high refractive index layer and a low refractive index layer in an optical film thickness of $\lambda/4$. That is, the DBR is formed of a laminated structure in which the low refractive index layer and the high refractive index layer are alternately laminated. The laminated structure has a structure in which the refractive index is periodically changed in the thickness direction. Because of this periodic change of refractive index, an incident light to the DBR is reflected at the interfaces of the respective layers in phase with each other. As a result, the reflected waves on the respective layers are reinforced with each other, and the DBR functions as a reflector.

M. Grabherr et al., IEEE Photonics Technology Letters, vol. 9, no. 10, 1997, pp 1304 (Non-Patent Document 1) discloses a surface emitting laser that includes an oxidized structure on a layer that constitutes the DBR, and confines a current that is injected into an active layer to limit an emitting region of the active layer. Hereinafter, the surface emitting laser (also called "surface emitting laser of selective oxidation type") having an oxidized confinement structure will be described with reference to FIG. 8.

Referring to FIG. 8, a DBR 802 including an $Al_{0.2}Ga_{0.8}As$ high refractive index layer 808 and an AlAs low refractive index layer 809 being alternately laminated is disposed on a GaAs semiconductor substrate 801. An AlGaAs cavity 803 having three GaAs quantum wells and spacer layers is disposed on the DBR 802. A DBR 804 including an $Al_{0.2}Ga_{0.8}As$ high refractive index layer 810 and an $Al_{0.9}Ga_{0.1}As$ low refractive index layer 811 being alternately laminated and doped with a p-type impurity is formed on the cavity 803.

An AlAs layer 805 that is 30 nm thick is introduced into the low refractive index layer that is positioned at a portion closest to the cavity 803 among the $Al_{0.9}Ga_{0.1}As$ low refractive index layers 811 that constitute the DBR 804. Further, an upper electrode 806 and a lower electrode 807 for current injection are formed on the upper portions of the DBR 804 and a rear surface of the semiconductor substrate 801, respectively. The DBR 802 is doped so as to be an n-type and the DBR 804 is doped so as to be a p-type.

The AlAs layer 805 is selectively oxidized in order to form the oxidized confinement structure. Because the AlAs layer 805 has a higher content of Al than other layers that constitute the DBR 804, its oxidation rate is higher, so that it is selectively oxidized in a high-temperature steam atmosphere. A semiconductor having a refractive index of about 3.1 changes into an insulator (aluminum oxide) having a refractive index of about 1.6 through this oxidation.

In Non-Patent Document 1, the selectively oxidized layer containing a larger amount of Al is disposed in the low refractive index layer 811 that constitutes the DBR as described with reference to FIG. 8. Then, the AlAs layer 805 becomes an oxidized region 812 and a non-oxidized region 813 through an oxidization process from the lateral direction to form the oxidized confinement structure.

Incidentally, the beam of a fundamental transverse mode of the vertical cavity surface emitting laser is a narrow-spread beam having a Gaussian intensity distribution whose center intensity is high. For that reason, as a light source for exposure in an electrophotographic device that demands a small-spot beam having a light intensity concentrated into the center, the beam of the fundamental transverse mode is more desirable than the beam of higher-order transverse modes.

Further, when multiple transverse modes lase at the same time, the transverse modes get unstable according to the operating conditions and the operating environments of the vertical cavity surface emitting laser. That is, hopping occurs between the modes, and the beam divergence angle and the intensity distribution change.

From the viewpoint of the above background, lasing of a stable single fundamental transverse mode is desirable.

Under the above circumstances, in Non-Patent Document 1, the diameter of a non-oxidized region (region 813 of FIG. 8) (hereinafter referred to as "confinement diameter") is narrowed to provide the single fundamental transverse mode.

However, the inventors of the present invention have found that as a result of calculating the reflectance of the DBR including the non-oxidized region 813 and the reflectance of the DBR including the oxidized region 812 in the configuration illustrated in FIG. 8, the reflectance of the DBR including the oxidized region 812 is higher. (The details of the calculation conditions will be described later.)

That is, the inventors of the present invention have found that the provision of the oxidized confinement structure makes the reflectance of a peripheral portion of the DBR higher than that of a center portion thereof in the configuration of the conventional art. As a result, the reflectance of the light of a higher order mode having a larger amount of power distribution in the peripheral portion is higher than the reflectance of the light of a fundamental mode having a larger amount of power distribution in the center portion, thereby reaching a recognition for the first time that the conventional configuration has an influence of facilitating the lasing of the higher order mode.

In particular, when the confinement diameter of the oxidized confinement structure is expanded for the purpose of providing higher output, the transverse mode control with the oxidized confinement structure is insufficient, and the laser structure is affected by the DBR and liable to lase in multimode.

SUMMARY OF THE INVENTION

Under the above circumstances, an object of the present invention is to provide a vertical cavity surface emitting laser that is capable of suppressing the lasing of a multiple mode and has a function of confining a current, and an image forming apparatus using the vertical cavity surface emitting laser.

According to an aspect of the invention, a vertical cavity surface emitting laser includes a first mirror, a cavity having an active layer, and a second mirror that are laminated, wherein the second mirror is a multilayer reflector comprised of a first layer and a second layer that are alternately plurally laminated, the second layer having a refractive index that is higher than that of the first layer, and at least one of the plural second layers constituting the multilayer reflector has an oxidized confinement structure having an oxidized region and a non-oxidized region for limiting an emitting region of the active layer region.

According to another aspect of the invention, an image forming apparatus includes an array light source having a plurality of the vertical cavity surface emitting lasers, an optical deflector for reflecting a laser beam that is output from the array light source and conducting scanning, a photosensitive element for forming an electrostatic latent image with a light that is deflected by the optical deflector, and a developer for developing the electrostatic latent image.

Further features of the present invention will become apparent from the following description of exemplary embodiments with reference to the attached drawings.

DESCRIPTION OF THE EMBODIMENTS

First Embodiment

Vertical Cavity Surface Emitting Laser

A first embodiment of the present invention will be described with reference to FIG. 1A.

A laser according to the first embodiment of the present invention is directed to a vertical cavity surface emitting laser including a first mirror 1002, a cavity 1000 having an active layer (the details of the active layer are omitted from the figure), and a second mirror 1010 that are laminated.

The second mirror 1010 is a multilayer reflector comprised of a first layer 1014 of a first refractive index and a second layer 1012 of a second refractive index that are alternately plurally laminated, the second refractive index being higher than the first refractive index. Further, an oxidized region 1016 is provided in a peripheral portion 1500 of a layer 1022 which is a part of the second layer 1012 constituting the multilayer reflector. More specifically, the oxidized region 1016 having a refractive index that is lower than the second refractive index is interposed between regions 1032 and 1042 which are of the second refractive index in the thickness direction of the layer 1022.

Figure 1A:
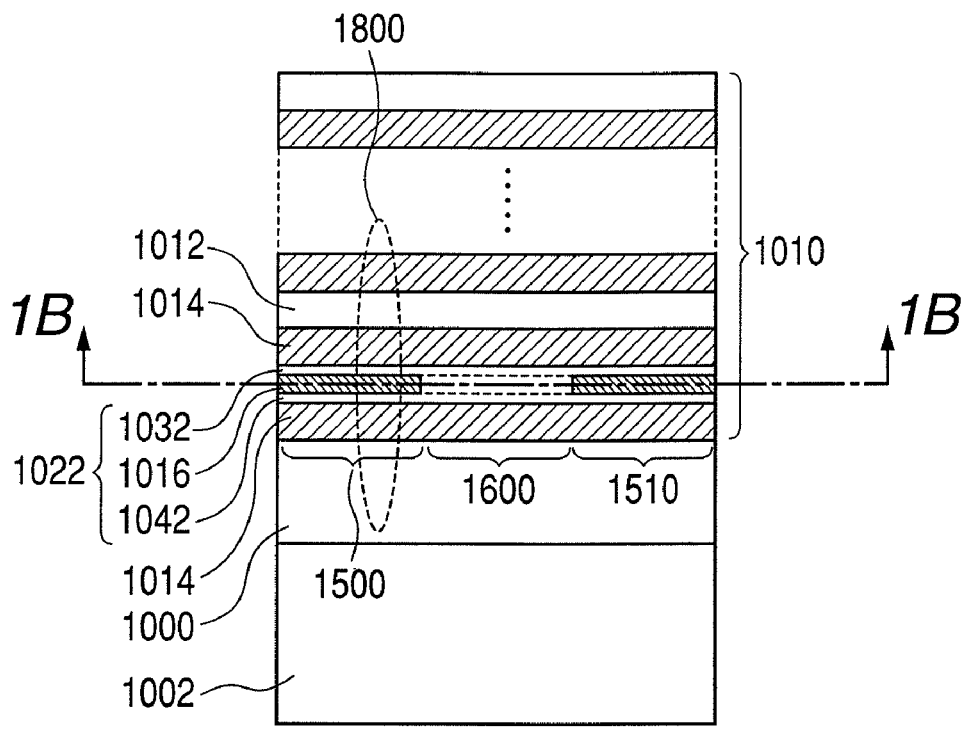
FIGS. 1A and 1B are diagrams illustrating a cross sectional structure of a laser for describing the present invention.

Referring to FIG. 1A, a layer having the oxidized region 1016 in the peripheral portion 1500 of the second layer among the plural second layers constituting the second mirror 1010 is indicated as reference numeral 1022.

Figure 1B:
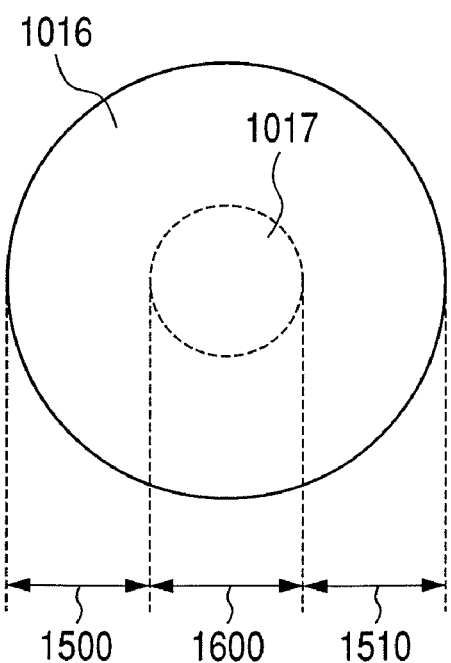

In this example, a cross section at a position including the peripheral portion 1500 (cross section taken along a line 1B-1B of FIG. 1A) is made up of peripheral portions 1500, 1510, and a center portion 1600 as illustrated in FIG. 1B. Although the details will be described later, the peripheral portions 1500 and 1510 are constituted by the oxidized region 1016, and the non-oxidized region exists in the center portion 1017.

Figure 2A:
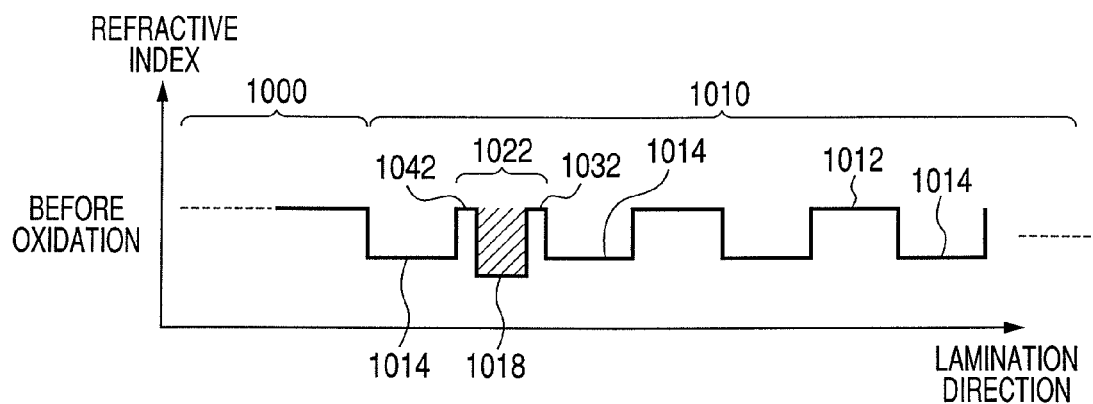
FIGS. 2A and 2B are conceptual diagrams illustrating a change in refractive index in a laminating direction.

FIG. 2A illustrates a change in the refractive index in the laminating direction at a portion of a dotted frame 1800 in FIG. 1A. That is, FIG. 2A illustrates a change in the refractive index in the direction of laminating the cavity 1000 of the surface emitting laser and the DBR 1010 that is formed right on the cavity 1000.

In the present invention, as illustrated in FIG. 2A, a selective oxidation layer 1018 is arranged in the interior of the high refractive index layer 1012 among the second layer (high refractive index layer) 1012 and the first layer (low refractive index layer) 1014 that constitutes the DBR.

Figure 2B:
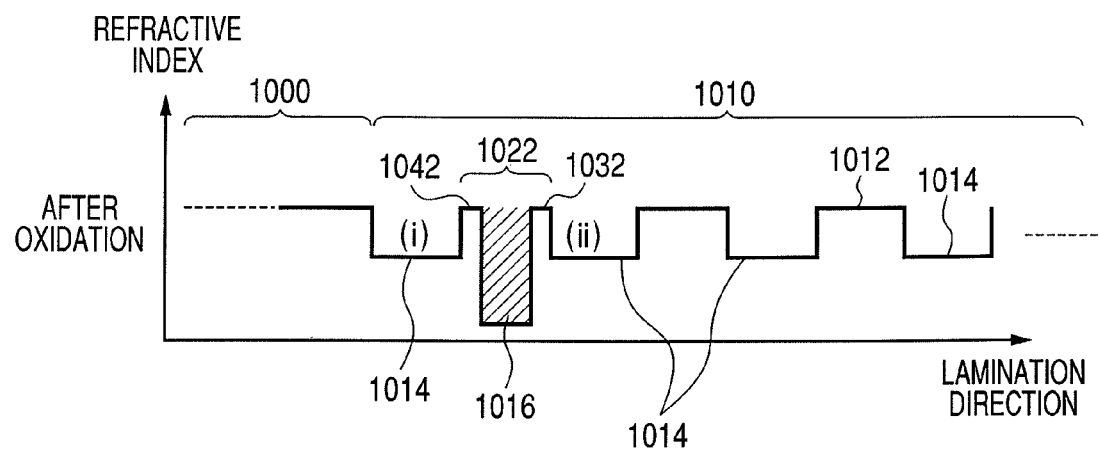

When the selective oxidation layer 1018 is oxidized by an oxidizing process, the refractive index of the oxidized portion is decreased to exhibit a refractive index distribution illustrated in FIG. 2B. This figure illustrates a state in which the selective oxidation layer 1018 is changed into the oxidized layer 1016 through the oxidizing process, and the refractive index of the selective oxidation layer 1018 is further decreased.

When the emission wavelength is $\lambda$, the DBR is normally configured in such a manner that a pair of a high refractive index layer and a low refractive index layer is alternately plurally laminated with an optical film thickness of $\lambda/4$. As illustrated in FIG. 2B, in the configuration of the present invention, when considering with the optical film thickness of $\lambda/4$, the oxidized region 1016 that constitutes the oxidized confinement structure is positioned at the portion 1022 where the high refractive index layer should be arranged.

As described above, in the present invention, since a material having a low refractive index is disposed in the portion 1022, the periodic distribution of the refractive index in the laminating direction in terms of the entire DBR layer 1010 is disturbed. More specifically, in FIG. 2B, layers 1042, 1018, and 1032 of which the average refractive index is low are arranged after the low refractive index layer 1014($i$) right above the cavity 1000. Further, a low refractive index layer 1014($ii$) that is disposed after those layers has a high refractive index compared with the oxidized layer 1016.

In the DBR according to the present invention, reflected waves from the interfaces between the portion 1022 including the oxidized layer 1016 and the upper and lower low refractive index layers 1014($i$) and 1014($ii$) thereof function so as to cancel the reflected waves from other interfaces. As a result, the refractive index of the DBR layer 1010 including the oxidized portion 1022 is decreased.

Figure 3:
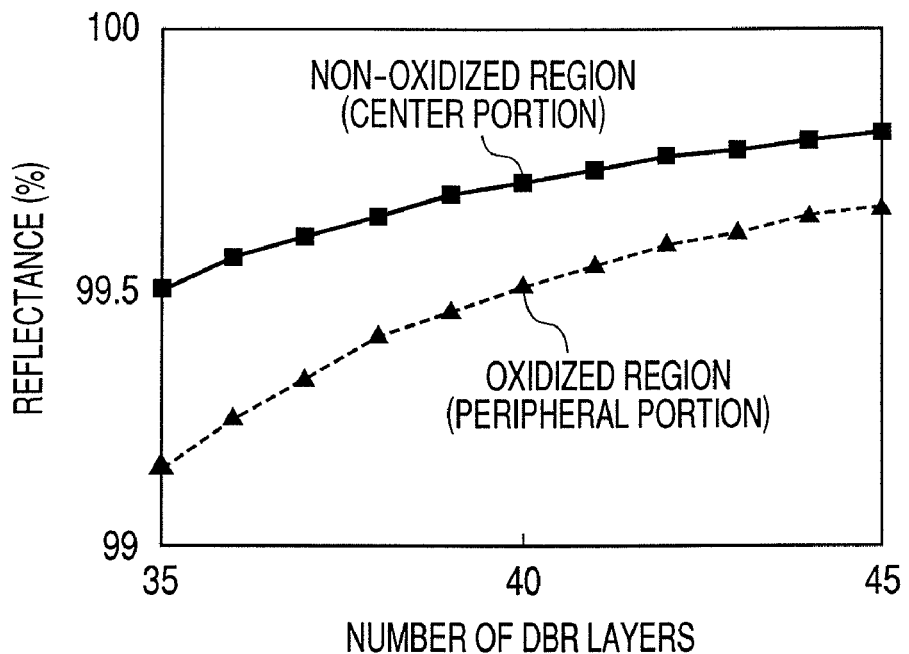
FIG. 3 is a graph indicating a difference in reflectance between an oxidized region and a non-oxidized region.

FIG. 3 illustrates the calculation results of the refractive indices of the peripheral portion 1500 in which the selective oxidation layer is oxidized and the center portion 1600 in which the selective oxidation layer is not oxidized in the embodiment of the present invention. The axis of abscissa in the figure represents the repetition number of the lamination of the DBR, and the axis of ordinate represents the reflectance.

The calculation model is for the light output side DBR 1010 having the oxidized confinement structure for a red surface emitting laser to calculate the reflectance viewed from the cavity 1000 including the active layer. For example, the low refractive index layer 1014 of the DBR is made of $Al_{0.5}Ga_{0.5}As$, and the high refractive index side is made of $Al_{0.9}Ga_{0.1}As$. The oxidized region 1016 is positioned in the center of the high refractive index layer, and is 30 nm in the thickness, and 680 nm in the lasing wavelength. Both of the thicknesses of the high refractive index portions 1032 and 1042 on both sides of the oxidized regions 1016 illustrated in FIGS. 1A and 1B are set to 12 nm in the calculation. The thickness of the low refractive index layer 1014 is 54 nm.

The reflectance calculation uses the characteristic matrix. In FIG. 3, it is found that the reflectance of the peripheral portion 1500 which is the oxidized region is lower than the reflectance of the center portion 1600 which is the non-oxidized region. It is confirmed from FIG. 3 that, in the configuration of the present invention, the selective oxidation layer is oxidized to allow the reflectance in the resonating direction including the oxidized region to decrease.

When the reflectance of the center portion 1600 in the DBR 1010 is made higher and the reflectance of the peripheral portion 1500 is made lower as described above, the lasing is liable to occur in the single transverse mode. This is because the light of the higher order mode having a larger amount of power distribution in the peripheral portion overlaps with the region in which the reflectance of the DBR is low.

As a result, in the configuration of the present invention, the reflectance distribution has an influence of suppressing the higher order mode lasing even when the confinement diameter is made larger than a diameter by which the single transverse mode can be maintained in the conventional example. For that reason, the single mode operation can be maintained up to the larger confinement diameter as compared with the conventional example.

Figure 9A:
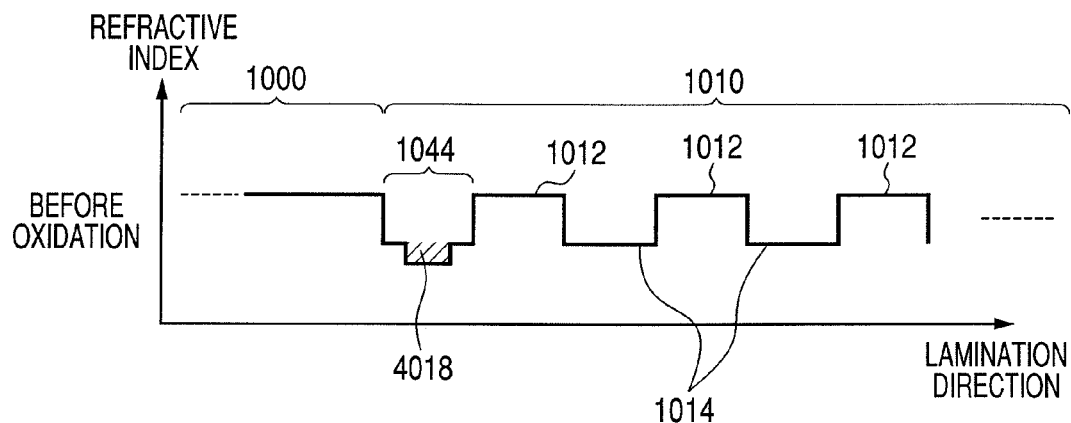
FIGS. 9A and 9B are conceptual diagrams illustrating a change in refractive index in the laminating direction.

On the other hand, FIG. 9A illustrates the layer configuration of a known configuration that is generally used such as the typical one disclosed in Non-Patent Document 1, and illustrates a change in the refractive index in the laminating direction of the cavity 1000 of the surface emitting laser and the DBR 1010 that is formed directly on the cavity 1000.

Figure 9B:
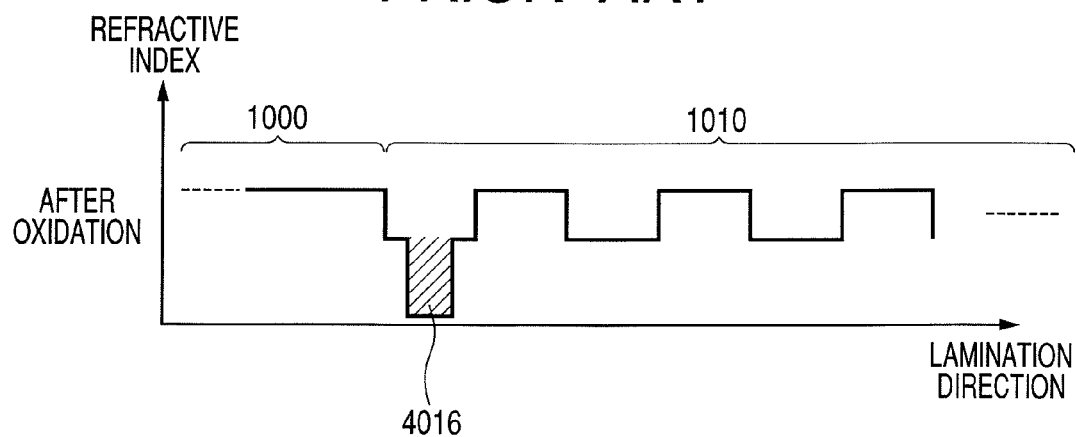

In the configuration illustrated in FIG. 9A, an oxidized layer 4018 is arranged within the low refractive index layer 1044, and the selective oxidation layer becomes an oxidized region 4016 due to oxidation, and its refractive index is greatly decreased (this state is illustrated in FIG. 9B).

In this case, the refractive index distribution in the laminating direction changes, and the layer is to be such a layer that the refractive index should be lowered as compared with the upper and lower layers, and the periodicity of the refractive index distribution in the laminating direction of the layers that constitute the DBR 1010 does not change.

For that reason, because the phases of the waves that are reflected on the respective interfaces of the DBR 1010 are identical with those in FIG. 9A, the reflected waves on the respective interfaces are reinforced with each other. Further, the difference in the refractive index between the low refractive index layer 1044 having the oxidized region 4016 and the upper and lower high refractive index layers 1012 thereof becomes larger, and the reflectance of the entire DBR also increases.

Figure 10:
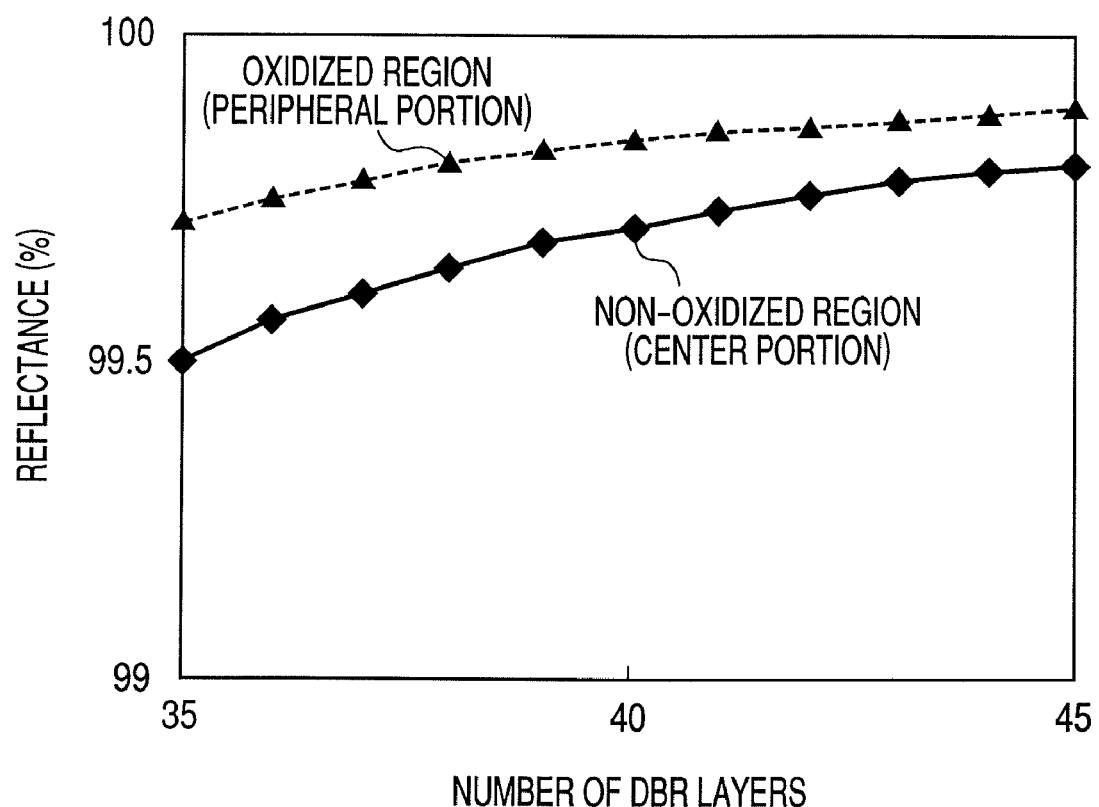
FIG. 10 is a graph indicating a difference in reflectance between the oxidized region and the non-oxidized region.

FIG. 10 illustrates the calculation results of the refractive indices of the peripheral portion that is the oxidized region and the center portion that is the non-oxidized region when the oxidized layer is arranged in the low refractive index layer 1044 within the DBR 1010 as disclosed in Non-Patent Document 1. The configuration is identical with that of the calculation model illustrated in FIG. 3 except for the position of the oxidized region. In FIG. 10, it can be recognized that the reflectance of the peripheral portion increases due to the oxidization.

(Oxidized Region)

In the vertical cavity surface emitting laser according to the present invention, as illustrated in FIG. 1A, the high refractive index layer (second layer) 1022 including the oxidized confinement structure may not necessarily be limited to one layer. For example, two, three, or more layers can be provided as the high refractive index layer.

Further, it is preferred that the oxidized region be formed in the peripheral portion of the second layer closest to the cavity from the viewpoint of the current confinement.

In the oxidized region, it is necessary that the current that is injected from the second mirror is confined to the inside of the peripheral portion, and that the reflectance of the peripheral portion in the resonating direction of the cavity is lowered as compared with that of the inside (center portion) of the peripheral portion.

In the above description, the oxidized region is disposed on the second mirror side. The first mirror can be also formed of a multilayer mirror, and the oxidized region can be disposed in the high refractive index layer that constitutes that multilayer. Further, the oxidized regions can be disposed on both of the first mirror and the second mirror.

In order to prevent the disturbance of the interfaces which is attributable to the provision of the oxidized layer, it is preferred that portions made of a high refractive index material (denoted by reference numerals 1032 and 1042 in FIG. 1A) be disposed on both sides of the oxidized region 1016 in the thickness direction from the viewpoint. Further, it is preferred that the real thickness (not the optical thickness) of the portions 1032 and 1042 may be set in a range of the following numerical values.

More specifically, the thicknesses of the portions 1032 and 1042 are preferably set to 5 nm or more and 19 nm or less, and more preferably set to 7 nm for the portion 1032 and 17 nm for the portion 1042. As a result of the study by the inventors of the present invention, it is unnecessary that the thicknesses of the portions 1032 and 1042 are equal to each other, and the thicknesses of those portions can be asymmetrical with each other. In particular, it is found that the portion 1032 is set to 7 nm, and the portion 1042 is set to 17 nm, thereby enabling the reflectance of the oxidized region to be most reduced.

Further, when the oxidized regions are disposed on the peripheral portions of a plurality of the second layers, the confinement diameters that are defined by the respective oxidized regions can be made different from each other. More specifically, when the confinement diameter of a first oxidized confinement structure which is formed on the second layer closest to the cavity is a first diameter and the confinement diameters of second oxidized confinement structures which are formed on the other second layers are second diameters. It is preferred to design a structure such that the first diameter is larger than the second diameters. In particular, the structure is effective in the case where the light loss of the fundamental mode should not be largely affected by the existence of the oxidized region at a side close to the active layer.

In the structure of the conventional example, the density distribution of current which is injected into the active layer is slightly higher in the outer peripheral portion and slightly lower in the center portion in the emission portion (portion of the active layer which is positioned below the non-oxidized portion 813).

On the other hand, the light intensity distribution of the fundamental mode is a unimodal intensity distribution with the highest intensity in the center, and thus in the outer peripheral portion of the emission portion it is ⅓ or less compared to the center. For that reason, because the fundamental mode and the density distribution of the injection current are different, it is difficult to efficiently consume the injected carriers with only the fundamental mode, and the conversion efficiency of the laser is deteriorated. Then, the carriers of the outer peripheral portion which cannot be consumed by the fundamental mode give a gain to the higher order modes with the effect that the higher order mode lasing is facilitated.

On the contrary, when the confinement diameter (698; first confinement diameter) is made larger than the confinement diameter (699; second confinement diameter), the density distribution of current injected into the active layer is of a unimodal distribution with the highest in the center as compared with the conventional example. For that reason, the distribution of the current injection density is closer to the density distribution of the fundamental mode (unimodal distribution) as compared with the conventional example, and the fundamental mode can efficiently consume the carriers due to induced emission. Further, the conversion efficiency of the laser can be improved, and the lasing of the higher order modes due to the excess carriers that exist in the outer periphery of the emission portion can be suppressed. There is a case in which the electric resistance of the laser increases due to a reduction in the confinement diameter 699. However, it is possible to reduce the increase in electric resistance by increasing the doping concentration in the periphery of a layer 606.

Figure 6:
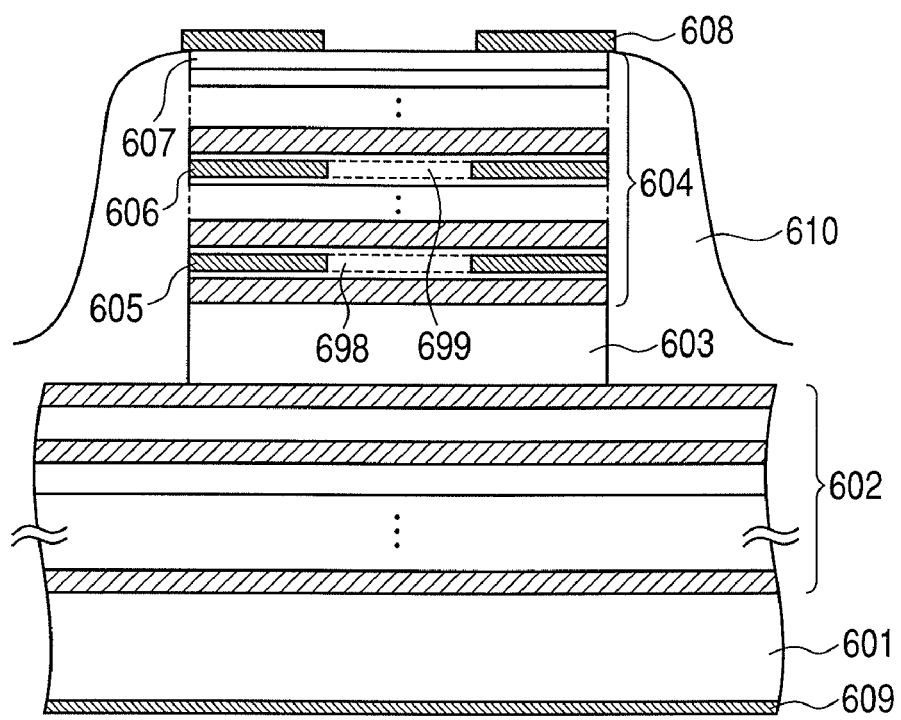
FIG. 6 is a schematic cross-sectional view illustrating a laser structure in a second embodiment of the present invention.

Further, in order to thus change the oxidized confinement diameter, portions of the cavity 603 and the second mirror 604 illustrated in FIG. 6 are formed in a trapezoidal mesa (upper surface side, or the electrode 608 side, is in a projected shape) in advance by etching for separating those portions from other devices. In the case where the selective oxidation layers have the same thickness, when processes of forming the oxidized regions of the oxidized regions 605 and 606 are conducted at the same time, the peripheral portion of the same length in the in-plane direction is oxidized. When the configuration before the oxidizing process is the mesa configuration, a structure in which the first confinement diameter at a side closer to the cavity 603 is larger than the second confinement diameter is realized. When the portions of the cavity 603 and the second mirror 604 are not of the mesa but etched substantially perpendicularly to the in-plane direction of the substrate as illustrated in the schematic diagram of FIG. 6, the thicknesses of the selective oxidation layers are made different from each other in advance, thereby making it possible to control the diameter relationship between the first and second confinement diameters.

In the case of a normal oxidizing process, the oxidizing region forming rate when the selective oxidation layer is thick is higher than that in the case where the selective oxidation layer is thin. Accordingly, when the selective oxidation layer for forming the first confinement diameter is thicker than the selective oxidation layer for forming the second confinement diameter, a structure in which the first confinement diameter is larger than the second confinement diameter can be produced.

(Material)

The first mirror 1002, the cavity 1000, and the second mirror 1010 can be laminated on the substrate in the stated order to provide the laser. For example, when the present invention is applied to a red laser, the substrate is made of n-type GaAs, and the first mirror is formed of an n-type semiconductor multilayer reflector which is made of AlGaAs. Then, the active layer that constitutes the cavity can be made of GaInP, and the spacer layer can be made of AlGaInP or AlInP. Further, the second mirror is formed of a p-type semiconductor multilayer reflector which is made of AlGaAs. The more details of the material configuration and the film thickness will be described with reference to an embodiment to be described later.

Further, in the present invention, the first mirror may not necessarily be the DBR mirror, and for example, a photonic crystal structure having a periodic refractive index variation in the in-plane direction can be used. Further, the relationship of the substrate and the second mirror can be substrate/first mirror/cavity/second mirror or substrate/second mirror/cavity/first mirror, as long as the current injection can be conducted.

The features of the present invention can be applied to not only the so-called laser for red emission, but also the laser of blue or of the shorter wavelength side such as GaN type.

Second Embodiment

Application Device

There are expected various application devices (image display apparatus or image forming apparatus) by using the vertical cavity surface emitting laser described in the first embodiment as a light source. Needless to say, it can be also used as an array light source having multiple lasers.

Figure 5A:
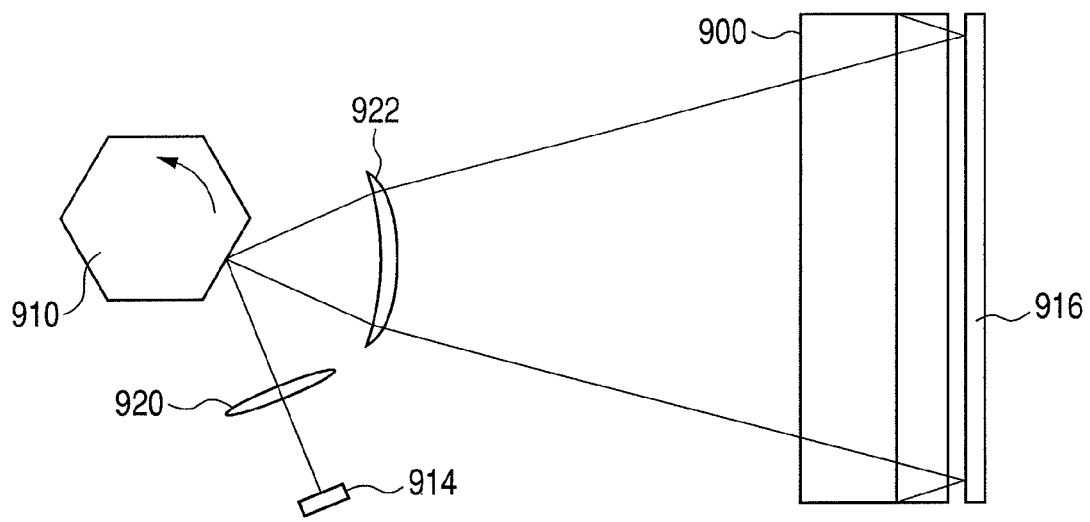
FIGS. 5A and 5B are diagrams for describing an image forming apparatus according to the present invention.
Figure 5B:
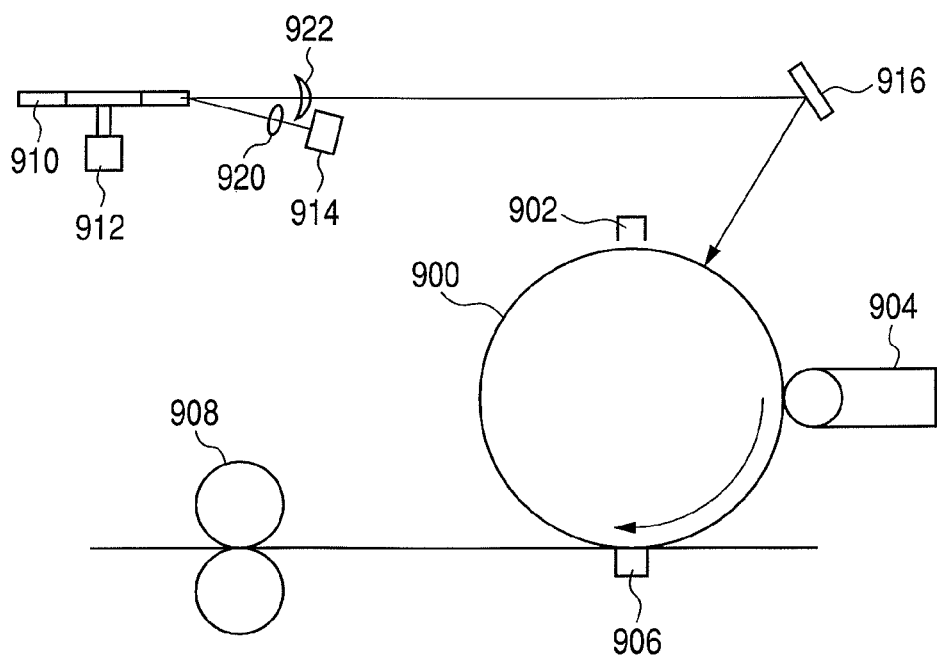

When the present invention is applied to the image forming apparatus, as illustrated in FIGS. 5A and 5B, the image forming apparatus includes a light source that is a vertical cavity surface emitting laser 914, and an optical deflector 910 for reflecting a laser beam output from the vertical cavity surface emitting laser 914 and conducting scanning. The configuration of the optical deflector 910 is not particularly limited as long as the optical deflector 910 has a function of reflecting the laser beam and a function of scanning the reflecting direction.

For example, the image forming apparatus such as a copying machine or a laser beam printer can be realized by the following configuration. That is, the image forming apparatus includes an optical deflector for reflecting the laser beam output from the light source and conducting scanning, a photosensitive element for forming an electrostatic latent image with the laser beam that has been deflected by the optical deflector, and a developer for developing the electrostatic latent image.

The configuration of the optical deflector 910 is not particularly limited as long as the optical deflector 910 has a function of reflecting the laser beam and a function of scanning the reflecting direction.

As the optical deflector 910, may be used, for example, a polygon reflector, a polygon mirror, or a reflector in which a thin piece body made of Si or the like is lased.

The electrophotographic device includes, for example, a drum-shaped photosensitive element 900 for forming an electrostatic latent image by means of a laser beam deflected by an optical deflector 910, a charger 902, a developer 904, and a fuser 908.

Even when the red surface emitting laser according to the present invention is used for the image display apparatus such as a display, the optical deflector 910 can be combined for the constitution.

Further, multiple red surface emitting lasers described above can be arranged in an array, and applied to the image forming apparatus as multiple beams.

FIGS. 5A and 5B illustrate structural diagrams of an image forming apparatus of the electrophotographic recording type in which the red surface emitting laser array according to the present invention is mounted. FIG. 5A is a top view illustrating the image forming apparatus, and FIG. 5B is a side view of the image forming apparatus.

FIGS. 5A and 5B includes a photosensitive element 900, a charger 902, a developer 904, a transfer charger 906, a fuser 908, a rotating polygon mirror 910 as an optical deflector, a motor 912, a red surface emitting laser array 914, a reflector 916, a collimator lens 920, and an f-θ lens 922.

Referring to FIG. 5B, the motor 912 rotationally drives the rotating polygon mirror 910. In this embodiment, the rotating polygon mirror 910 has six reflecting surfaces.

The surface emitting laser array 914 is a recording light source. The surface emitting laser array 914 is turned on or off according to an image signal by a laser driver (not shown), and the laser beam thus modulated is emitted toward the rotating polygon mirror 910 from the red surface emitting laser array 914 through the collimator lens 920.

The rotating polygon mirror 910 rotates in a direction indicated by the arrow, and the laser beam that is output from the surface emitting laser array 914 is reflected as a deflected beam that continuously changes the output angle on the reflecting surface with the rotation of the rotating polygon mirror 910. The reflected beam is subjected to a distortion correction by means of the f-θ lens 922, irradiated onto the photosensitive element 900 through the reflector 916, and scanned on the photosensitive element 900 in the main scanning direction. In this situation, an image for multiple lines in correspondence with the red surface emitting laser array 914 is formed in the main scanning direction of the photosensitive element 900 by the reflection of the laser beam through one surface of the rotating polygon mirror 910. In this embodiment, the 4×8 red surface emitting laser array 914 is used, and an image for 32 lines is formed at the same time.

The photosensitive element 900 is charged by the charger 902 in advance, and sequentially exposed by scanning the laser beam to form an electrostatic latent image. Further, the photosensitive element 900 rotates in the direction indicated by the arrow, and the formed electrostatic latent image is developed by the developer 904, and the developed visible image is transferred onto a transfer paper (not shown) by means of the transfer charger 906. The transfer paper onto which the visible image has been transferred is conveyed to the fuser 908, and then discharged outside after being fixed.

As the array, for example, a 4×8 red surface emitting laser array can be used.

EXAMPLES

First Example

Hereinafter, a first example of the present invention will be described.

Figure 4:
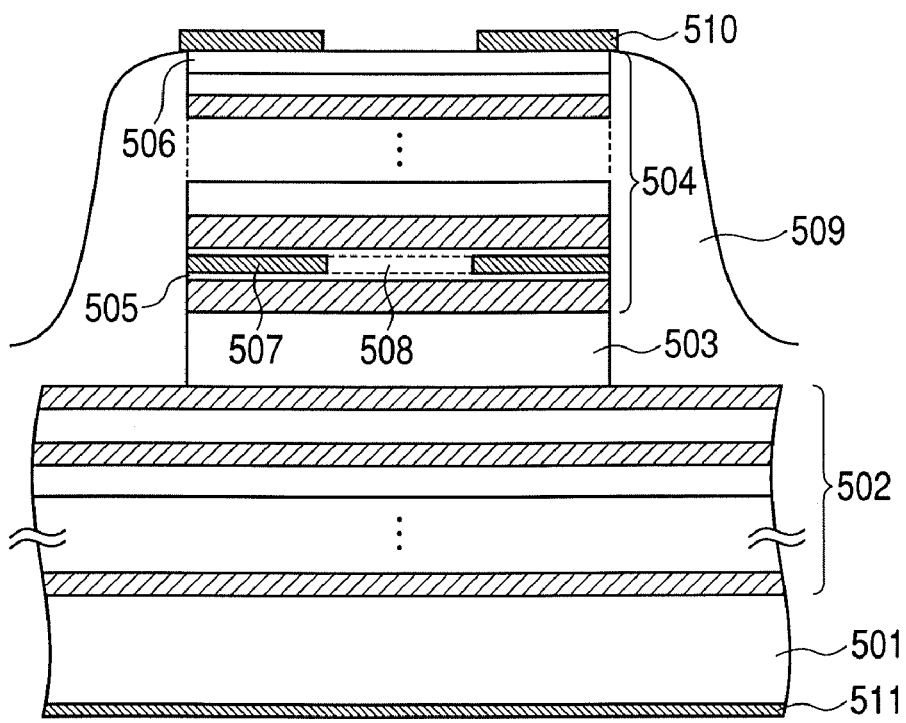
FIG. 4 is a schematic cross-sectional view illustrating a laser structure in a first embodiment of the present invention.

FIG. 4 illustrates a schematic cross-sectional view of a surface emitting laser structure according to a first example.

The surface emitting laser structure in this example is configured as follows.

That is, the surface emitting laser includes an n-type GaAs substrate 501, an n-type $Al_{0.9}Ga_{0.1}As/Al_{0.5}Ga_{0.5}As$ multilayer reflector 502, and a cavity 503 having four $Ga_{0.45}In_{0.55}P$ quantum wells and an AlGaInP layer that sandwiches the quantum wells. Further, the surface emitting laser includes a p-type $Al_{0.9}Ga_{0.1}As/Al_{0.5}Ga_{0.5}As$ multilayer reflector 504, and an $Al_{0.9}Ga_{0.02}As$ layer 505 having a thickness of 30 nm which is inserted into an $Al_{0.5}Ga_{0.5}As$ layer that is a first layer from the active layer of the multilayer reflector 504. Further, the surface emitting laser includes a highly doped p-type GaAs layer 506 that is 10 nm thick, a $SiO_2$ 509 for electric insulation and post protection, an upper electrode 510, and a lower electrode 511 on the rear surface of the substrate.

In the present specification, the "post" means a columnar portion that is formed of the cavity 503 and the multilayer reflector 504.

Further, as for the real thickness (not optical thickness) of the p-type multilayer reflector, $Al_{0.9}Ga_{0.1}As$ that forms a low refractive index layer (first layer) is 54 nm and $Al_{0.5}Ga_{0.5}As$ is 50 nm.

The $Al_{0.9}Ga_{0.02}As$ layer 505 is oxidized from the lateral direction in the device processing step, and divided into an oxidized region 507 and a non-oxidized region 508.

Further, the repetition number of the n-type multilayer reflector 502 is 60 periods, the repetitions number of the p-type multilayer reflector 504 is 36 periods, and the optical thickness of the two kinds which constitute the multilayer reflector is ¼ wavelength of the lasing wavelength 660 nm.

A composition graded layer that continuously changes the compositions of Al and Ga can be disposed on the layer interface of the multilayer reflectors 502 and 504 in order to reduce the electric resistance.

The practical device manufacturing procedure will be described below.

First, the above layer configuration is allowed to grow by an organometallic vapor phase epitaxial method or a molecular beam epitaxy to provide a growth wafer. The wafer is removed up to the cavity 503 or below the cavity 503 by dry etching through a semiconductor lithography or a semiconductor etching technique to form a columnar post that is about 30 μm in diameter.

The $Al_{0.9}Ga_{0.02}As$ oxidized confinement layer 505 is formed by oxidation from the lateral direction in a water vapor atmosphere of about 450° C. In this situation, the oxidation time is controlled to produce the oxidized region 507 that conducts current and optical confinement and the center portion 508 that is not oxidized. The oxidation time is controlled so that the diameter of the center portion 508 becomes about 4 μm.

The insulating film 509 is formed through a plasma CVD method that is an insulating film deposition method or a lithography method that is a pattern forming method so as to cover the post side surface and the etched portion.

The p-side and n-side electrodes 510 and 511 are deposited through a vacuum deposition method and a lithography method. The electrode 510 is formed with a circular window for light extraction.

In order to obtain excellent electric characteristics, a device in which the electrodes and the semiconductor are alloyed in a high temperature nitrogen atmosphere is completed.

In the method disclosed in Non-Patent Document 1, because the confinement diameter of the oxidized confinement layer is small, the output is largely restricted. Further, as disclosed in Non-Patent Document 1, when the confinement diameter is made larger (4 μm in Non-Patent Document 1), the light output can become larger, but lasing is liable to occur in the multiple modes including the higher order transverse modes.

The causes of the higher order transverse mode operation are: i) an increased overlap of the light distribution with the active region due to the enlarged confinement diameter, and ii) a reduced difference in the scattering loss within the cavity between the transverse modes. However, when the reflectance of the DBR in the outside in the radial direction perpendicular to the propagation of the beam is made lower than that in the inside as in this example, such configuration has an effect of suppressing the higher order mode. For that reason, even if the confinement diameter is made larger in order to increase the light output to thereby produce the effects of i) and ii), the higher order mode operation can be suppressed.

Second Example

A description will be given of a structure in which the oxidized confinement layer is disposed on multiple high refractive index layers that constitute the DBR in a second example.

FIG. 6 illustrates a schematic cross-sectional view illustrating a surface emitting laser structure according to this example.

The surface emitting laser structure according to this example includes on a GaAs substrate 601 an n-type multilayer reflector 602, an active layer 603 that is identical with that in the first example which is constituted by quantum wells and a barrier layer, and a p-type $Al_{0.9}Ga_{0.1}As/Al_{0.5}Ga_{0.5}As$ multilayer reflector 604.

Further, the surface emitting laser structure includes selective oxidation layers 605 and 606 of $Al_{0.9}Ga_{0.02}As$ which are 30 nm thick, which are inserted into $Al_{0.5}Ga_{0.5}As$ layers which are first and twelfth layers from the active layer of the p-type multilayer reflector 604. Further, the surface emitting laser structure includes a highly doped p-type GaAs layer 607, an upper electrode 608, and a lower electrode 609 on the rear surface of the substrate.

The device configuration of this example is identical with that of the first example except that the selective oxidation layer is inserted into the $Al_{0.5}Ga_{0.5}As$ layer which is the twelfth layer of the p-type multilayer reflector.

The device manufacturing is conducted in the same process as that in the first example. The two selective oxidation layers are oxidized under the oxidizing conditions for the selective oxidation layers which are disclosed in the first example, and the two selective oxidation layers are oxidized at the same time. The vertical cavity surface emitting laser having the two oxidized confinement layers is completed through the above process.

The reason why the two oxidized confinement layers are provided in the second example is because the reduction of the reflectance in the oxidized region can be increased as compared with the case where only one oxidized confinement layer is introduced so as to increase the effect of the fundamental mode selection, as indicated by the results of calculation which will be described below.

The reason why the selective oxidation layer is the twelfth layer in the second example will be described below.

Figure 7:
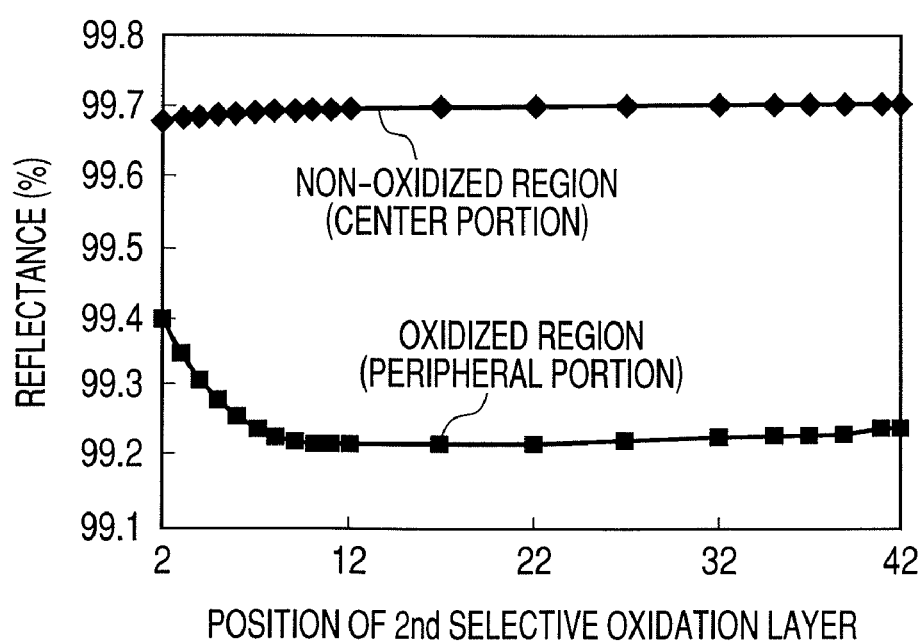
FIG. 7 is a graph indicating a difference in reflectance between the oxidized region and the non-oxidized region.
Figure 8:
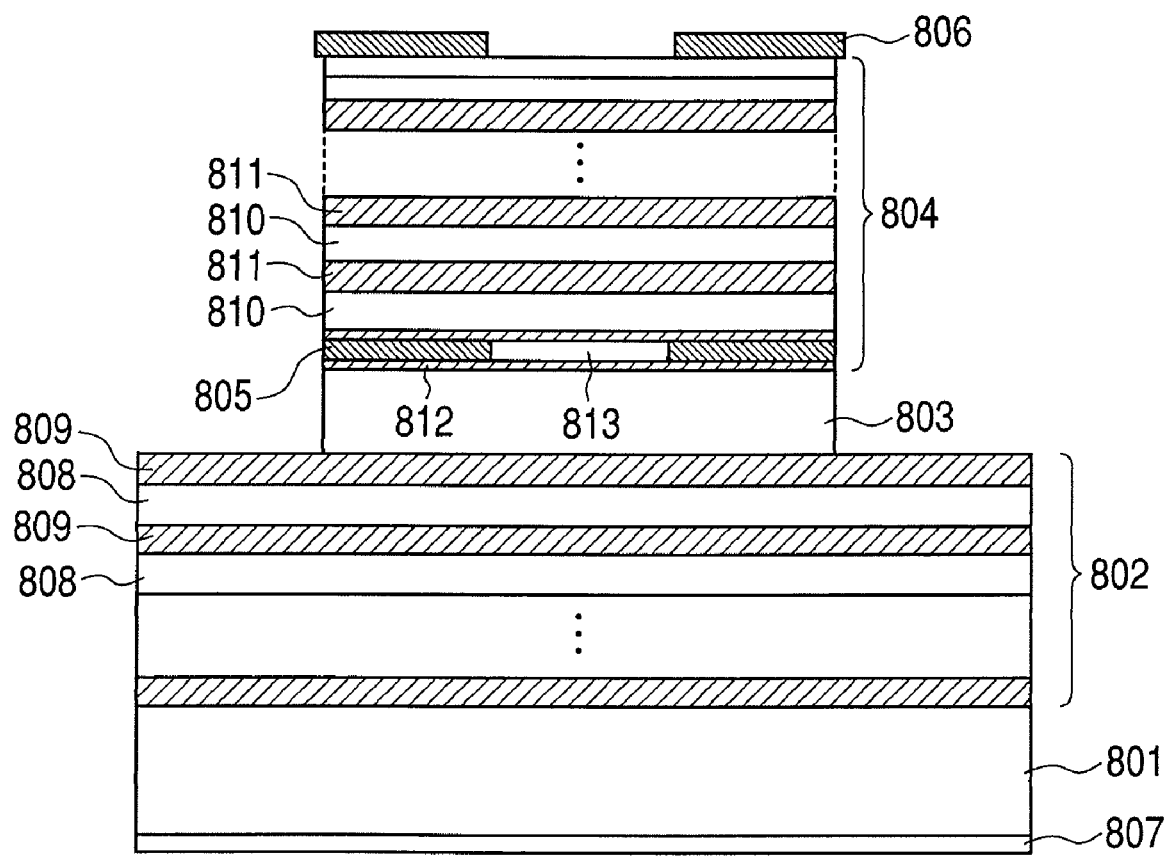
FIG. 8 is a cross-sectional view illustrating a cross sectional structure in a laser according to Non-Patent Document 1.

FIG. 7 illustrates a reflectance dependency of the position of the oxidized layer in the case where two selective oxidation layers are used. FIG. 7 illustrates the calculation results of the reflectance in the case where the first oxidized layer is fixed to the high refractive index layer of the DBR closest to the active layer (the same position as that of selective oxidation layer in the first example), and the other oxidized layer is inserted into a high refractive index layer that is laminated thereabove. The axis of abscissa of FIG. 7 represents the number of layers which are counted up from the cavity of the high refractive index in which the second layer is arranged. For example, in the case of the layer position 3, the second oxidized layer is put in the high refractive index layer that constitutes the third DBR viewed from the active layer. Since the first oxidized layer is fixed to the high refractive index of the first layer right above the cavity, the calculation model in the case where the axis of abscissa is the layer position 3 in the figure is a model in which the oxidized layers are arranged on the high refractive index layers of the first and third layers. The reason why the first selective oxidation layer is fixed to the high refractive index layer closest to the active layer is because the confined current is prevented from being expanded. It is found from the figure that a difference in reflectance is largest when the second selective oxidation layer position is about the twelfth layer, and the vicinity of that position is an optimum point in the above configuration. For that reason, that position is taken in the second example.

Because the optimum position of the selective oxidation layer varies according to parameters such as the layer thickness or the material which constitutes the surface emitting laser, the optimum position is not always limited to the twelfth layer.

Further, it is preferred that, as to the confinement diameter (698 or 699 of FIG. 6) which is defined by the selective oxidation layer, the confinement diameter (698) that is positioned at a portion close to the active layer side is larger than the confinement diameter (699) which is positioned at a farther portion. In particular, it is preferred that the confinement diameter (698) that is positioned at the portion close to the active layer side is a confinement diameter corresponding to the light distribution in a single fundamental transverse mode so that a large influence is not given to the light loss of the single fundamental transverse mode.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-245540, filed Sep. 21, 2007, which is hereby incorporated by reference herein in its entirety.

What is claimed is:

1. A vertical cavity surface emitting laser comprising a first mirror, a cavity that includes an active layer, and a second mirror that are laminated, wherein the second mirror is a multilayer reflector that includes a first layer and a second layer that are alternately plurally laminated, the second layer having a refractive index that is higher than that of the first layer, wherein each of at least two of the plural second layers included in the multilayer reflector has an oxidized confinement structure having an oxidized region and a non-oxidized region, with each oxidized confinement structure being arranged substantially as a center layer of its second layer.

2. A vertical cavity surface emitting laser according to claim 1, wherein each of more than two of the plural second layers has a corresponding oxidized confinement structure.

3. A vertical cavity surface emitting laser according to claim 1, wherein one of the oxidized confinement structure is formed in one of the plural a second layers that is closest to the cavity.

4. A vertical cavity surface emitting laser according to claim 1, wherein a confinement diameter of a first oxidized confinement structure that is formed in one of the at least two of the plural second layers that is closest to the cavity is larger than a confinement diameter of a second oxidized confinement structure that is formed in another one of the at least two of the plural second layers.

5. A vertical cavity surface emitting laser according to claim 1, wherein the first mirror, the cavity, and the second mirror are laminated on a substrate in stated order, wherein the substrate is made of an n-type GaAs, wherein the first mirror is a semiconductor multilayer reflector that includes AlGaAs, wherein the active layer of the cavity includes GaInP, and wherein the second mirror is a semiconductor multilayer reflector that includes AlGaAs.

6. A vertical cavity surface emitting laser according to claim 1, wherein the vertical cavity surface emitting laser is one of a plurality of vertical cavity surface emitting lasers incorporated in an array light source of an image forming apparatus that includes:

an optical deflector for reflecting a laser beam that is output from the array light source and conducting scanning;

a photosensitive element for forming an electrostatic latent image with a light that is deflected by the optical deflector; and a developer for developing the electrostatic latent image.

* * * * *